United States Patent [19]
Han

[11] Patent Number: 5,982,688
[45] Date of Patent: Nov. 9, 1999

[54] CIRCUIT AND METHOD FOR CONTROLLING BIT LINE FOR A SEMICONDUCTOR MEMORY DEVICE

[75] Inventor: Yong-joo Han, Seongnam, Rep. of Korea

[73] Assignee: Samsung Electronics, Co., Ltd., Suwon, Rep. of Korea

[21] Appl. No.: 08/996,918

[22] Filed: Dec. 23, 1997

[30] Foreign Application Priority Data

Jan. 30, 1997 [KR] Rep. of Korea .......................... 97-2881

[51] Int. Cl.[6] ....................................................... G11C 7/00
[52] U.S. Cl. ............................ 365/203; 365/194; 365/207
[58] Field of Search .................................... 365/149, 203, 365/189.11, 194, 193, 233, 190, 207

[56] References Cited

U.S. PATENT DOCUMENTS 4,941,128  7/1990  Wada et al. ............................ 365/203
5,623,446  4/1997  Hisada et al. ....................... 365/189.11

*Primary Examiner*—David Nelms
*Assistant Examiner*—Thong Le
*Attorney, Agent, or Firm*—Marger Johnson & McCollom, P.C.

[57] ABSTRACT

A first precharge circuit precharges a bit line to an equalization voltage during precharging operations and is disabled during charge sharing operations floating the bit line. A second precharge circuit precharges a bit line bar to an equalization voltage during precharging and charge sharing operations. Since the bit line is floated during charge sharing operations, and the bit line bar is continually precharged to an equalization voltage level, variation of the bit line bar voltage level due to a charge coupling between the bit line and the bit line bar during charge sharing is prevented. The difference in a level between the bit line and the bit line bar after the charge sharing can be detected by a sense and amplification circuit.

28 Claims, 12 Drawing Sheets

CIRCUIT AND METHOD FOR CONTROLLING BIT LINE FOR A SEMICONDUCTOR MEMORY DEVICE

FIELD OF THE INVENTION

The present invention relates to a semiconductor memory device and more particularly to an apparatus and method for controlling bit lines in a semiconductor memory device.

BACKGROUND OF THE INVENTION

Semiconductor memory devices such as a dynamic random access memory, include a memory cell array and a bit line pair for transferring data.

Writing data to a specific memory cell in a memory cell array or reading the data from the specific memory cell is performed by transmitting the data in the memory cell to a bit line by charge sharing. The data is then sensed using the difference in potential between the bit line and a bit line bar.

FIG. 1 is a circuit diagram showing a prior art bit line control circuit. The conventional bit line controlling circuit includes data lines 110 and 120, an equalizing and precharging portion 130, a memory cell array 140 and a sense and amplification portion 150.

The memory cell array 140 includes a plurality of memory cells each connected to the data lines 110 and 120. Each memory cell has a cell transistor and a cell capacitor. The memory cells are accessed by corresponding addresses and store data in the form of charge in a corresponding cell capacitor. A cell transistor is gated by a word line and transmits charge stored in a cell capacitor to a corresponding data line.

The data lines 110 and 120 act as a bit line (BL) and a bit line bar (/BL) with respect to corresponding memory cells. That is, if a memory cell selected for reading information is connected to the data line 110, the data line 110 becomes the bit line (BL) and the data line 120 becomes the bit line bar (/BL). On the other hand, if a memory cell selected for reading information is connected to the data line 120, the data line 120 becomes the bit line (BL) and the data line 110 becomes the bit line bar (/BL).

The equalizing and precharging portion 130 is connected between the data lines 110 and 120, controlled by an equalization control signal PEQ, and precharges the data lines 110 and 120 to equalization voltage VBL for a period of precharging. When the data line acting as the bit line BL shares charges, the equalizing and precharging portion 130 floats the data lines 110 and 120.

The sense and amplification portion 150 is controlled by a sensing control signal PIS, and senses and amplifies the difference in a voltage level between data lines 110 and 120.

Writing data into the memory cell array is performed by searching for the location of a desired memory cell. The location is determined by a combination of addresses applied from an external source. The data input in association with an address is converted into a charge to be stored in a cell capacitor in a designated memory cell. Reading the data is performed by converting the charge stored in the memory cell to a voltage, amplifying the converted voltage, and transmitting the amplified voltage to the outside.

Procedures of reading data stored in a desired memory cell will be described as follows. The data lines 110 and 120 are precharged to equalization voltage VBL by the equalizing and precharging portion 130 for a period of precharging. When the word line of a cell transistor in a corresponding memory cell is driven by a row address strobe signal RASB, the equalization controlling signal PEQ disables the equalizing and precharging portion 130, floating the precharged data lines 110 and 120.

According to where the desired memory cell is connected, one of the data lines 110 and 120 acts as the bit line. The charge stored in the memory cell is shared until the level of a storage node voltage Vs in the memory cell equals the voltage of the data line acting as the bit line. When the charge sharing operation is completed, the sense and amplification portion 150 senses the difference in potential between the data lines 110 and 120, amplifies the difference and then outputs the result under the control of a sensing control signal PIS.

FIG. 2 is a timing chart of each signal on the bit line control circuit shown in FIG. 1.

An equalizing signal PEQ is active during precharging. After precharging, the equalizing signal PEQ disables the equalizing and precharging portion 130 to float the data lines 110 and 120 precharged to the equalization voltage VBL.

A driving signal PIX is activated driving a word line corresponding to the row address strobe signal RASB. A data line connected to a corresponding memory cell (which is accessed by a driven word line) among the data lines 110 and 120 begins to share charge with the corresponding memory cell (refer to t1 of FIG. 2).

After a predetermined period of time, that is, after the potential of the data line and that of the memory cell are equalized by charge sharing (refer to t2 of FIG. 2), the sensing control signal PIS is activated enabling the sense and amplification portion 150.

In conventional bit line controlling circuits, while the data line acting as the bit line shares charge with a memory cell, the data line acting as the bit line bar floats while being precharged to the equalization voltage VBL. Therefore, during charge sharing from a period of time between t1 and t2 of FIG. 2, a coupling effect occurs between the data line acting as the bit line and that acting as the bit line bar. That is, the voltage level of the data line acting as the bit line varies due to charge sharing with a corresponding memory cell. The voltage level of the data line acting as the bit line bar is also changed. Consequently, the difference in voltage levels between the data lines after charge sharing becomes smaller than a predetermined value which can be accurately sensed by the sense and amplification portion.

Furthermore, as integration of memory cells increase, the time interval between the data lines acting as the bit line and the bit line bar becomes smaller. Embedded memory devices include an Application Specific Integrated Circuit (ASIC) field and a DRAM circuit manufactured on a signal chip. Accordingly, material layers of the data lines acting as the bit line and the bit line bar are replaced by metal layers instead of poly layers employed in the prior art. Thus, the vertical heights of the data lines acting as the bit line and the bit line bar increases increasing coupling capacitance. As a result, coupling effects of the data lines becomes worse, adversely effecting the sensing operation performed by the sense and amplification portion.

FIG. 3 shows the coupling effect occurring between the bit line and the bit line bar, in the conventional bit line controlling circuit of FIG. 1. Here, a vertical axis denotes the level of voltage and a horizontal axis denotes the time. Reference numerals 160 and 170 denote the potential values of the bit line and the bit line bar, respectively. Reference numeral t1 is the time when the charge sharing starts, and reference numeral t2 is the time when the sensing and amplifying operation starts being performed by the sense and amplification portion 150.

Referring to FIG. 3, during precharging, the bit line and the bit line bar are precharged to the equalization voltage VBL before charge sharing. During charge sharing (between t1 and t2), the potential of the bit line changes to VH due to the charge sharing of the bit line with a corresponding memory cell. The potential of the bit line bar is also changed into VHB due to the coupling effect with the bit line. Accordingly, after the time for charge sharing ends, the difference (VH−VHB) in potential between the bit line and the bit line bar becomes smaller than a predetermined value which can be effectively sensed by the sense and amplification portion 150. Thus, accurate data reading is difficult.

SUMMARY OF THE INVENTION

It is an object of the present invention to provide, in a semiconductor memory device, a bit line controlling circuit that offsets coupling effects between a bit line and a bit line bar during charge sharing.

It is another object of the present invention to provide a bit line controlling method that offsets coupling effects between a bit line and a bit line bar during charge sharing.

To accomplish the first object, the bit line controlling circuit includes a bit line, a bit line bar, an equalization power line, first precharging means, and second precharging means.

The equalization power line provides equalization power.

The first precharging means is connected between the equalization power line and the bit line and controlled by a first precharging control signal. The first precharging means precharges the bit line to an equalization voltage during precharging and is then disabled during charge sharing floating the bit line.

The second precharging means is connected between the equalization power line and the bit line bar and controlled by a second precharging control signal. The second precharging means precharges the bit line bar to an equalization voltage during precharging and during charge sharing.

To accomplish the second object, the bit line controlling method includes a precharging step, a bit line floating step, a charge sharing step and a bit line bar floating step. In the precharging step, the bit line and the bit line bar are precharged to predetermined identical voltage levels. In the bit line floating step, the bit line is floated after the precharging step.

In the charge sharing step, when the word line of a corresponding memory cell is enabled, the floated bit line shares charge with a corresponding memory cell after the bit line floating step. After the charge sharing step, the bit line bar is floated in the bit line bar floating step.

The above objects and advantages of the present invention will become more apparent by describing in detail a preferred embodiment thereof with reference to the attached drawings.

DETAILED DESCRIPTION OF THE INVENTION

Figure 4:
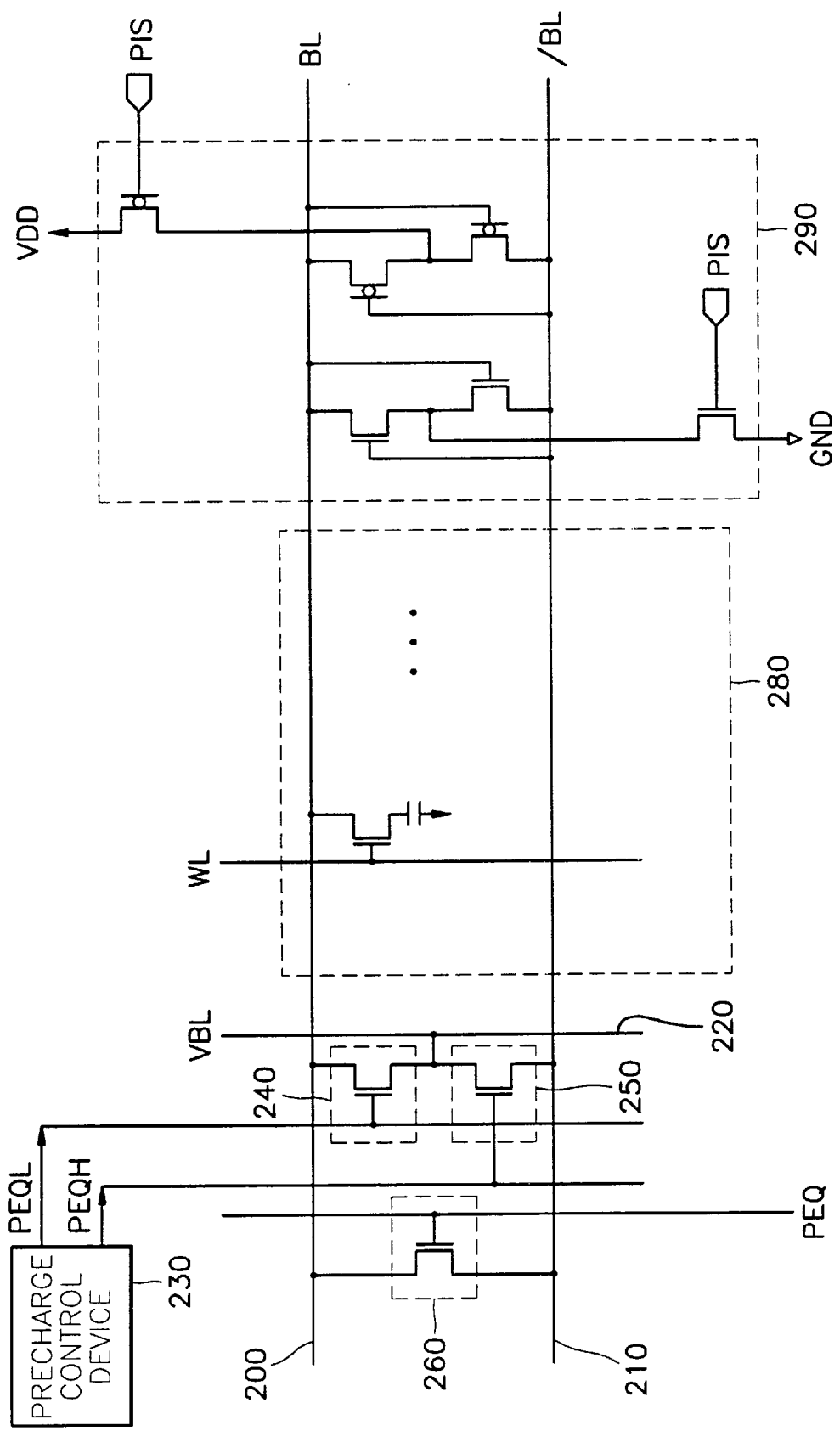
FIG. 4 is a circuit diagram showing a first embodiment of a bit line controlling circuit according to the present invention.

Referring to FIG. 4, a bit line control circuit according to a first embodiment of the present invention includes a bit line 200, a bit line bar 210, an equalization power line 220, a precharge control device 230, precharge portions 240 and 250, an equalizing portion 260, a memory cell array 280 and a sense and amplification portion 290.

The equalization power line 220 provides equalization voltage VBL. The precharge control device 230 generates control signals PEQH and PEQL for controlling the precharge portions 240 and 250. Here, the control signal PEQL enables the precharge portion 240 during precharging, and the control signal PEQH enables the precharge portion 250 during precharging and charge sharing.

The precharge portion 240 comprises an NMOS transistor having a drain connected to the bit line 200, a source connected to the equalization power line 220, and a gate to which the control signal PEQL is applied. The precharge portion 240 precharges the bit line 200 to equalization voltage VBL according to the control signal PEQL during precharging.

The precharge portion 250 comprises an NMOS transistor having a drain connected to the equalization power line 220, a source connected to the bit line bar 210, and a gate to which the control signal PEQH is applied. The precharge portion 250 precharges the bit line bar 210 to the equalization voltage VBL according to the control signal PEQH during precharging and charge sharing.

The equalization portion 260 is controlled by an equalizing control signal PEQ and equalizes the voltage levels of the bit line 200 and the bit line bar 210 to the equalization voltage VBL during precharging. Here, the equalization control signal PEQ is a signal which is activated only during the precharging.

The memory cell array 280 includes memory cells for storing data, wherein the data stored in the memory cells is accessed by addresses that designate specific memory cells. The addresses designating the memory cells are applied from outside the memory chip. The memory cells accessed by the addresses are connected with the bit line 200.

The sense and amplification portion 290 senses the difference in voltage level between the bit line 200 and the bit line bar 210 and amplifies the result.

Figure 5:
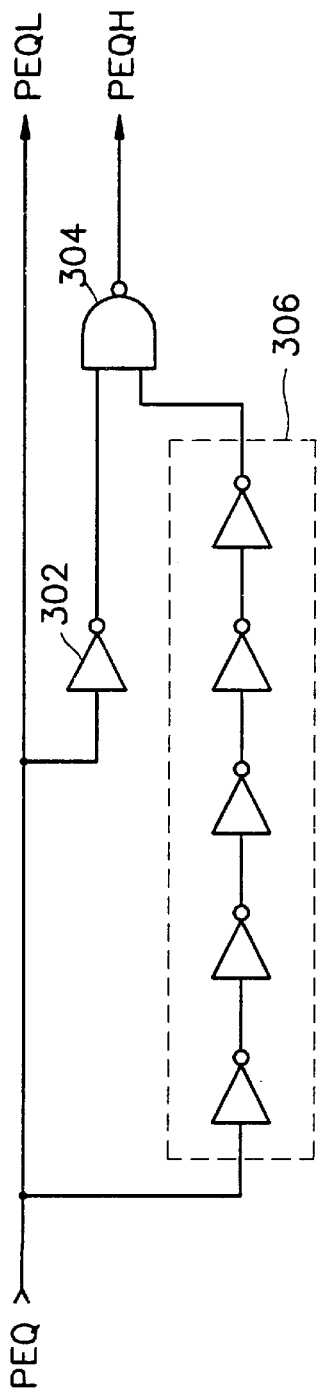
FIG. 5 is a circuit diagram showing a first embodiment of a precharging control portion shown in FIG. 4.

FIG. 5 is a circuit diagram showing a first embodiment of the precharge control device 230 of FIG. 4. The precharge control device 230 includes an inverter 302, a NAND gate 304 and a delay circuit 306. The inverter 302 receives the equalization control signal PEQ, inverts the received signal, and outputs the result.

The delay circuit 306 delays the equalization control signal PEQ for a predetermined period of time. Here, the predetermined period of time corresponds to the time required for the potential level of the bit line 200 to equal the charge in an accessed memory cell. That is, the time required for charge sharing.

The NAND gate 304 receives outputs from the inverter 302 and the delay circuit 306 and outputs a low level signal only when the output of the inverter 302 and the delay circuit 306 are both at high levels.

Figure 6:
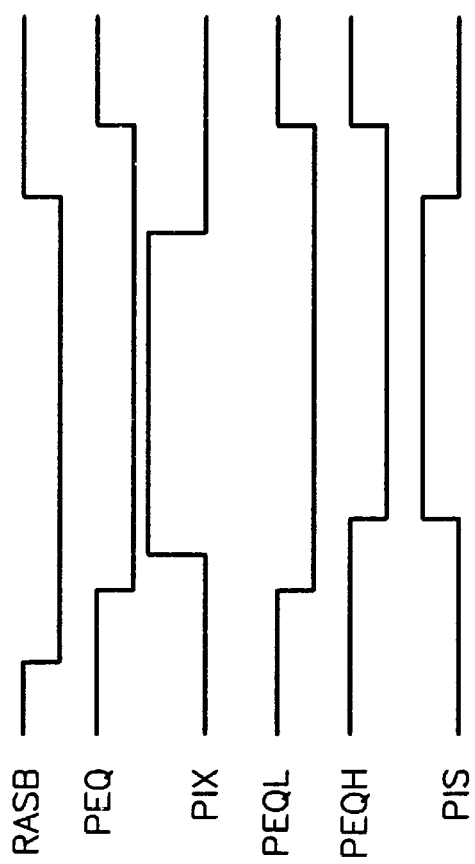
FIG. 6 is a timing diagram of each signal on a precharging control portion shown in FIG. 4.

FIG. 6 is a timing diagram of each signal in the precharge control device 230 of FIG. 5. As can be seen from FIGS. 5 and 6, a circuit according to the first embodiment of the precharge control device 230 outputs the equalization control signal PEQ as the control signal PEQL for controlling the precharge portion 240. The equalization control signal PEQ is delayed for a predetermined period of time, i.e., during precharging. The rising edge of the delayed signal synchronizes with the equalization control signal PEQ, outputting the result as the control signal PEQH.

The equalization control signal PEQ is active only during precharging. Accordingly, the control signal PEQL is active only during precharging to enable the precharge portion 240 to precharge the bit line 200 to the equalization voltage VBL. The control signal PEQH is active during precharging and also during charge sharing to enable the precharge portion 250 to precharge the bit line bar 210 to the equalization voltage VBL. Therefore, the bit line bar 210 is continually precharged to the equalization voltage VBL by the control signal PEQH during charge sharing with the accessed memory cell. This offsets the charge coupling effect occurring between the bit line 200 and the bit line bar 210.

Figure 7:
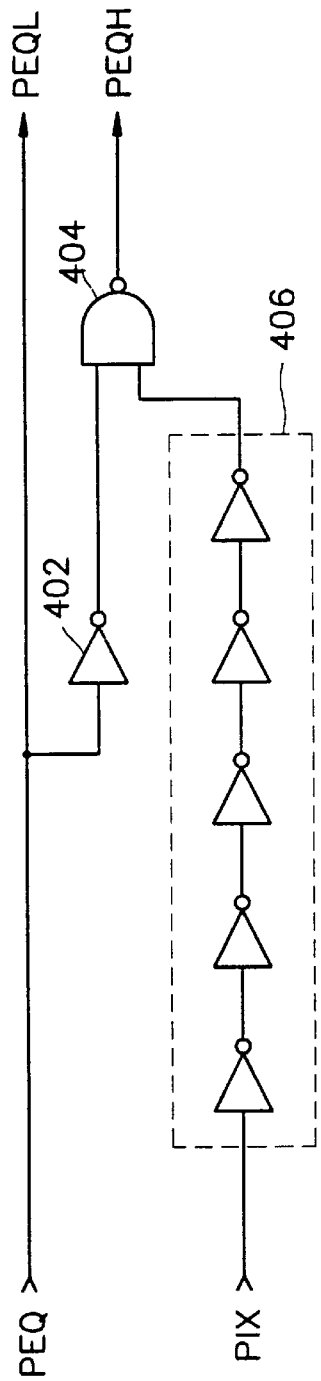
FIG. 7 is a circuit diagram showing a second embodiment of a precharging control portion shown in FIG. 4.

FIG. 7 is a circuit diagram of a second embodiment of the precharge control device 230 of FIG. 4. The precharge control device 230 includes an inverter 402, a NAND gate 404 and a delay circuit 406. The inverter 402 receives the equalization control signal PEQ, inverts the received signal, and outputs the result.

The delay circuit 406 delays a word line control signal PIX for a predetermined period of time. The word line control signal PIX when activated enables a word line driving a memory cell accessed according to a row address strobe signal RASB. Here, the predetermined period of time corresponds to the time required for the voltage potential level of the bit line 200 to be the same as that of a memory cell accessed by charging sharing, i.e., the time for charge sharing.

The NAND gate 404 receives outputs from the inverter 402 and the delay circuit 406 and outputs a low level ('L') signal only when the outputs from the inverter 402 and the delay circuit 406 are both a high level ('H').

Figure 8:
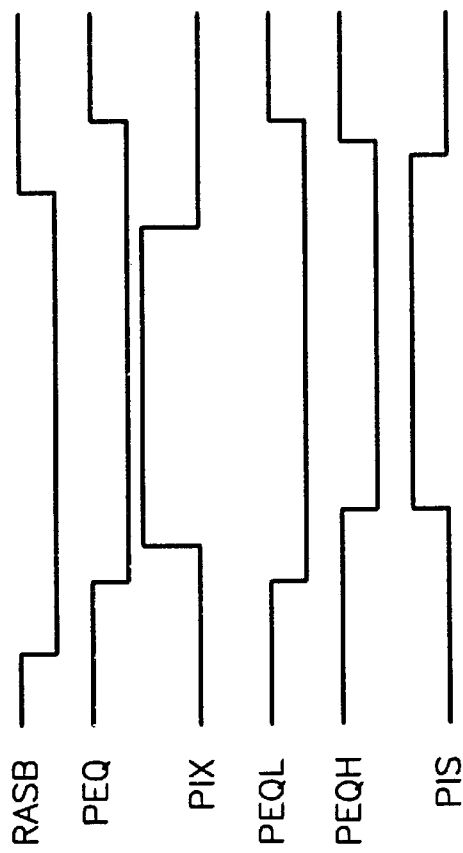
FIG. 8 is a timing chart of each signal on a precharging control portion shown in FIG. 7.

FIG. 8 is a timing chart of each signal in the precharge control device 230 of FIG. 7. A circuit according to another embodiment of the precharge control device 230 outputs the equalization control signal PEQ as the control signal PEQL for controlling the precharge portion 240. A word line control signal PIX is delayed for a predetermined period of time, i.e., during charge sharing, inverted and outputs as the control signal PEQH.

The word line control signal PIX is activated according to the row address strobe signal RASB to enable a word line driving an accessed memory cell. The control signal PEQL is active only during precharging to enable the precharge portion 240 to precharge the bit line 200 to the equalization voltage VBL. The control signal PEQH is active during precharging and also during charge sharing to enable the precharge portion 250 to precharge the bit line bar 210 to the equalization voltage VBL. Thus, while the bit line 200 shares charge with an accessed memory cell, the bit line bar 210 is continually precharged to the equalization voltage VBL by the control signal PEQH, offsetting the charge coupling effect occurring between the bit line 200 and the bit line bar 210.

Figure 9:
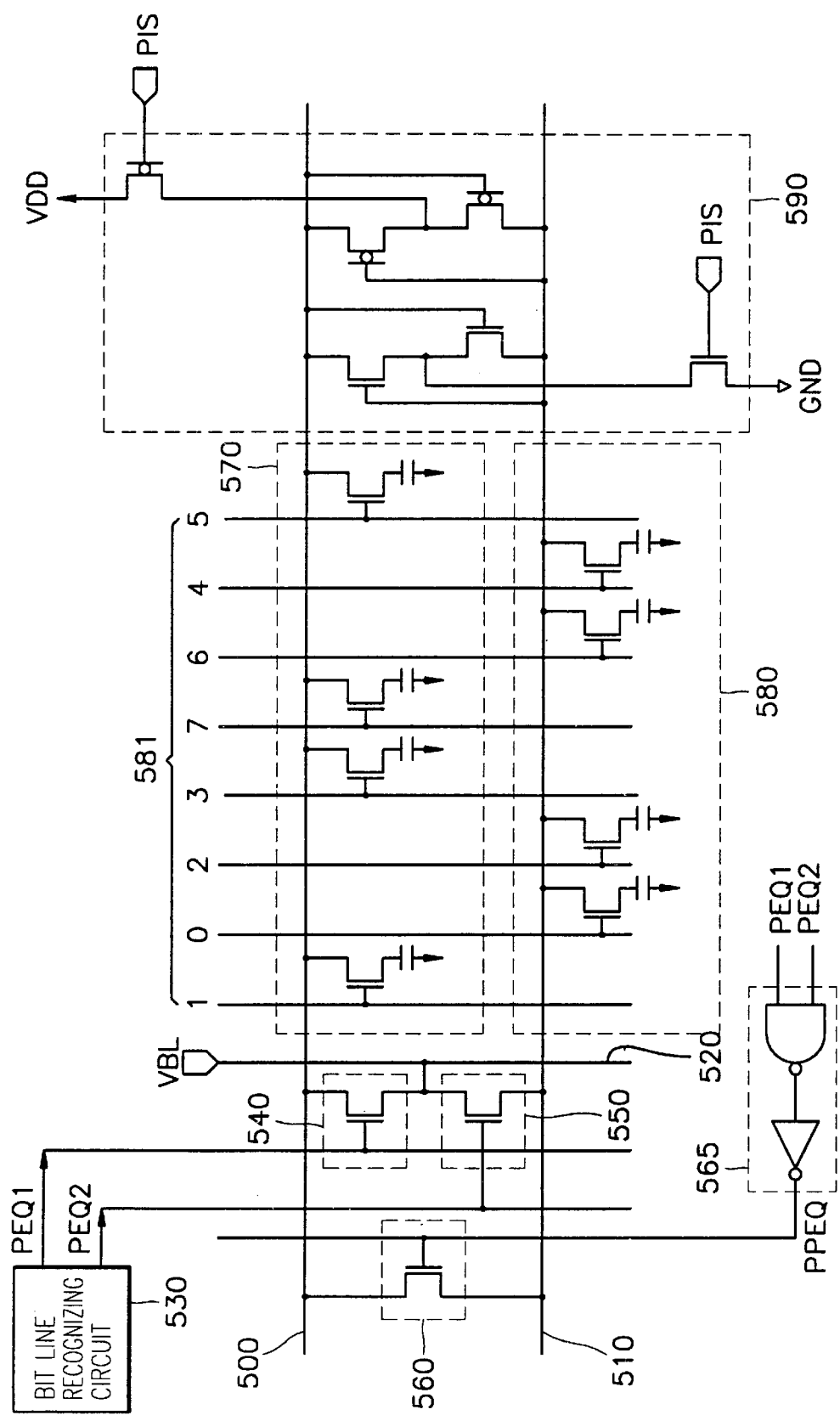
FIG. 9 is a circuit diagram showing a second embodiment of a bit line control circuit according to the present invention.

FIG. 9 is a circuit diagram showing a second embodiment of a bit line control circuit according to the present invention. The bit line control circuit according to another embodiment of the present invention includes data lines 500 and 510, an equalization power line 520, a bit line recognizing circuit 530, precharge portions 540 and 550, an equalization portion 560, an equalization portion control circuit 565, memory cell arrays 570 and 580 and a sense and amplification portion 590.

The data lines 500 and 510 operate as a bit line or a bit line bar depending on the connection state of a memory cell accessed. That is, when the accessed memory cell is connected to the data line 500, the data line 500 acts as the bit line and the data line 510 acts as the bit line bar. Also, when the accessed memory cell is connected to the data line 510, the data line 510 acts as the bit line and the data line 500 acts as the bit line bar. The equalization power line 520 provides equalization voltage VBL.

The bit line recognizing circuit 530 generates control signals PEQ1 and PEQ2 for controlling the precharge portions 540 and 550. The precharge portion 540 is controlled by the control signal PEQ1 and precharges the data line 500 to the equalization voltage VBL during precharging when the data line 500 acts as the bit line and during precharging and charge sharing when the data line 500 acts as the bit line bar.

The precharge portion 550 is controlled by the control signal PEQ2 and precharges the data line 510 to the equalization voltage VBL during precharging when the data line 510 acts as the bit line and during precharging and charge sharing when the data line 510 acts as the bit line bar.

The equalization portion 560 equalizes the data lines 500 and 510 to the equalization voltage VBL during precharging. The equalization portion control circuit 565 generates a control signal PPEQ for activating the equalization portion 560 only during precharging. Accordingly, when any one of the control signals PEQ1 or PEQ2 becomes a low level, the control signal PPEQ is deasserted to a low level.

The memory cell arrays 570 and 580 are connected to the data lines 500 and 510 according to a row address of a memory cell, respectively. Here, the memory device has a folded structure. That is, the memory cell array 570 is connected to the data line 500 and constitutes memory cells where the least significant bit of a row address is an odd number. The memory cell array 580 is connected to the data line 510 constitutes memory cells where the least significant bit of a row address is an even number. Reference numeral 581 denotes the values of the least significant bits of low addresses in memory cells shown in FIG. 9.

The sense and amplification portion 590 is controlled by a sensing control signal PIS, and senses the difference in voltage levels between the data lines 500 and 510 during sensing. The portion 590 amplifies the sensed difference, and outputs the result.

Figure 10:
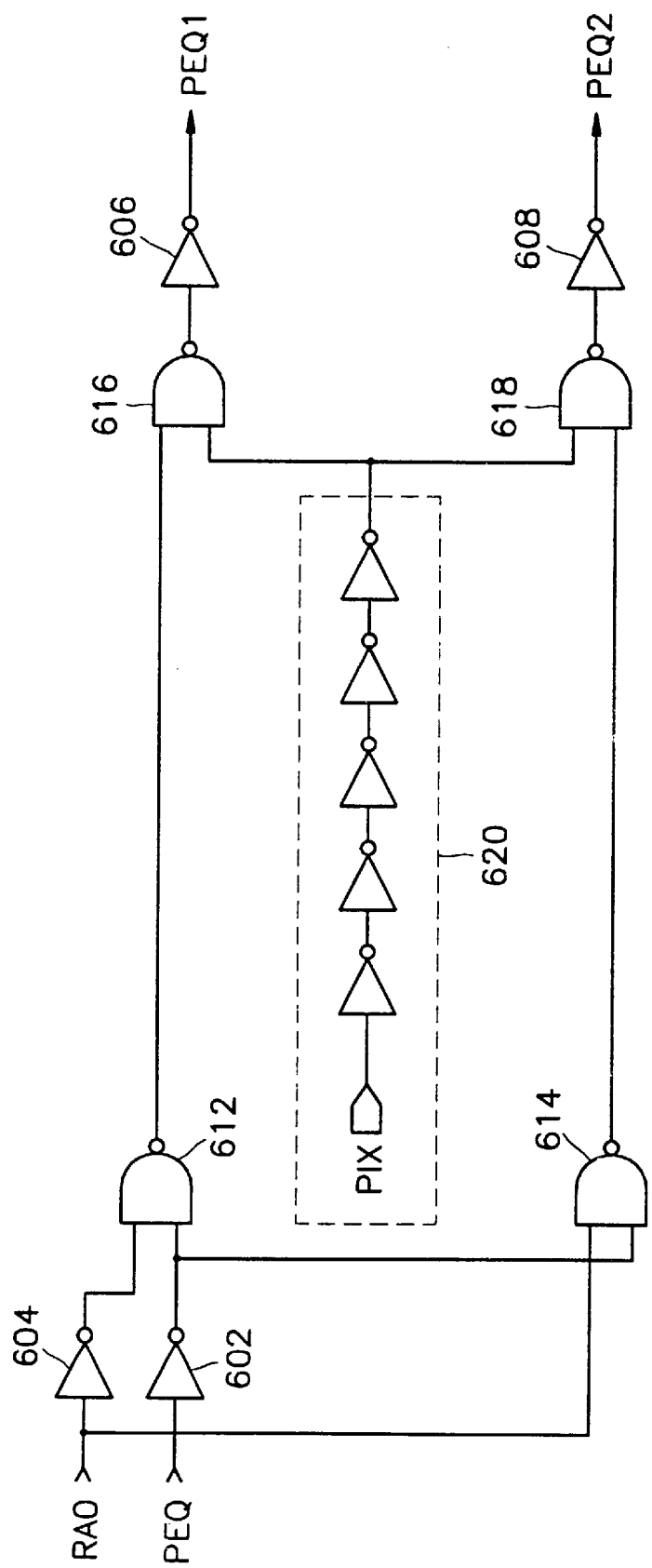
FIG. 10 is a circuit diagram of a bit line detection circuit shown in FIG. 9.

FIG. 10 is a circuit diagram showing an embodiment of the bit line recognizing circuit 530 shown in FIG. 9. The bit line recognizing circuit 530 includes inverters 602, 604, 606 and 608, NAND gates 612, 614, 616 and 618, and a delay circuit 620. The inverter 602 receives an equalization control signal PEQ, inverts the received signal, and outputs the result. The equalization control signal PEQ is active only during precharging. The inverter 604 receives the least significant bit (RAO) of a row address in an accessed memory cell, inverts the received bit, and outputs the result. The NAND gate 612 receives outputs from the inverters 604 and 602 and outputs a signals as a low level only when all of the input signals are in high level.

The NAND gate 614 receives the least significant bit of a row address (RAO) and the signal output from the inverter 602 and outputs a signal which becomes a low level only when all of the input signals are high voltage levels.

The delay circuit 620 receives a word line control signal PIX, delays the received signal for a predetermined period of time, inverts the delayed signal, and outputs the result. The word line control signal PIX enables a word line driving an accessed memory cell, according to a row address strobe signal RASB. The predetermined period of time corresponds to the time required for the potential level of the data line to be the same as that of an accessed memory cell, that is, the period of time for charge sharing.

The NAND gate 616 receives signals output from the NAND gate 612 and the delay circuit 620, and outputs a signal which becomes a low level only when all of the input signals are both high levels. The NAND gate 618 receives signals output from the NAND gate 614 and the delay circuit 620, and outputs a signal which becomes a low level only when both of the input signals are at high levels.

The inverter 606 receives the output of the NAND gate 616, inverts the received signal, and outputs the result as the control signal PEQ1. The inverter 608 receives the output of the NAND gate 618, inverts the received signal, and outputs the result as the control signal PEQ2.

Figure 11A:
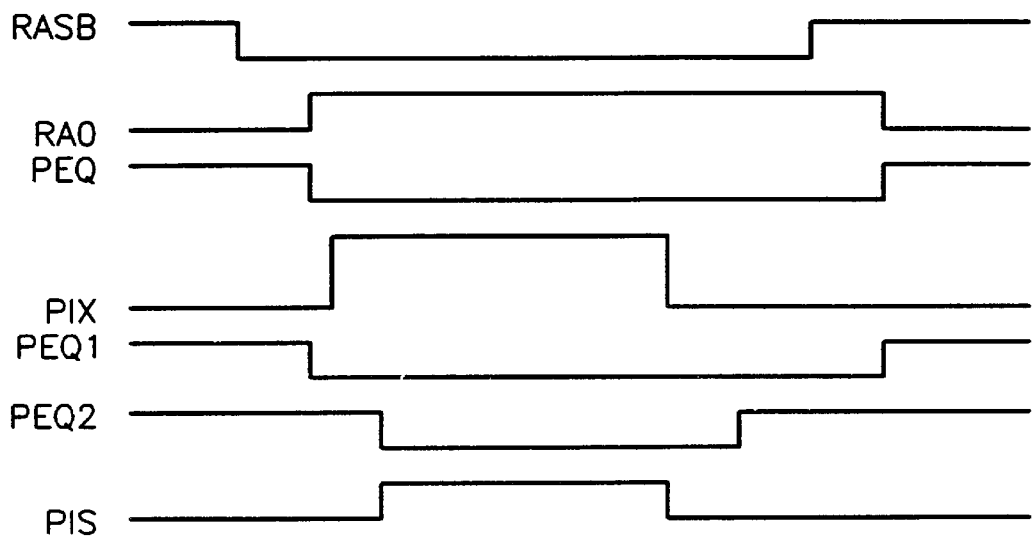
FIG. 11a is a timing diagram illustrating operations for the circuit in FIG. 10 when a least significant bit of a row address is an odd number.
Figure 11B:
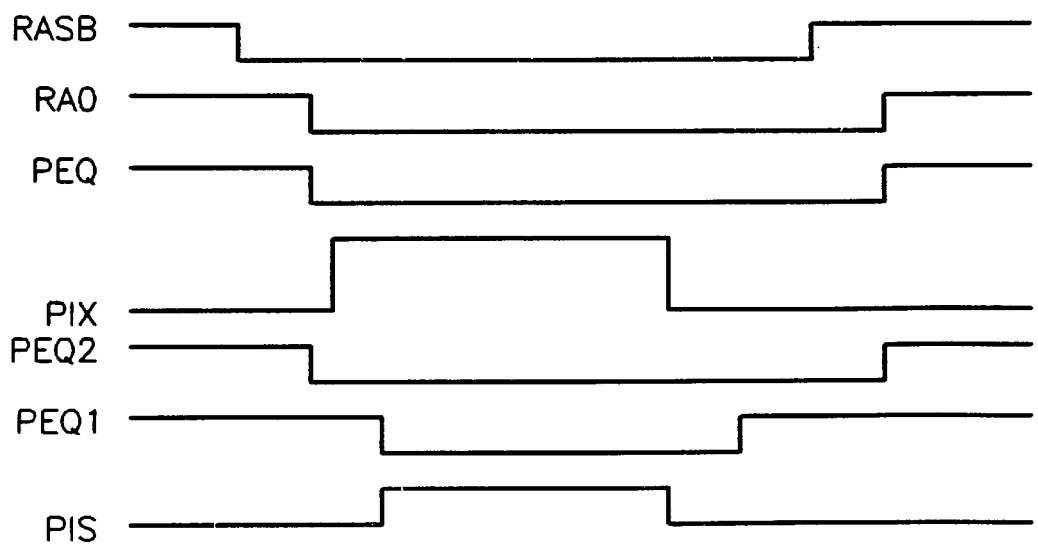
FIG. 11b is a timing diagram for the circuit in FIG. 10 when the least significant bit of a row address is an even number.

FIGS. 11a and 11b are timing diagrams illustrating the operation of the bit line recognizing circuit of FIG. 10. FIG. 11a shows the case in which the least significant bit of a row address (RAO) in an accessed memory cell is odd, and FIG. 11b shows the case in which the least significant bit of the row address (RAO) in the accessed memory cell is even.

As can be seen from FIGS. 10, 11a and 11b, the bit line recognizing circuit 530 recognizes which of the data lines 500 and 510 acts as the bit line or the bit line bar, and generates the control signals PEQ1 and PEQ2 for controlling the precharge portions 540 and 550 according to the result of the recognition.

When the least significant bit of a row address (RAO) in an accessed memory cell is odd, the data line 500 acts as the bit line and the data line 510 acts as the bit line bar. Accordingly, the equalization control signal PEQ is output as the control signal PEQ1 for controlling the precharge portion 540. The word line control signal PIX is delayed for a predetermined period of time required for charge sharing. The delayed signal is inverted and output as the control signal PEQ2 for controlling the precharge portion 550.

The equalization control signal PEQ is only active during precharging. The word line control signal PIX is activated according to the row address strobe signal RASB in order to enable a word line driving an accessed memory cell. The control signal PEQ1 is active only during precharging to enable the precharge portion 540 to precharge the data line 500 to the equalization voltage VBL. The control signal PEQ2 is activated during precharging and charge sharing to enable the precharge portion 550 to precharge the data line 510 to the equalization voltage VBL. While the data line 500 acting as the bit line shares charge with an accessed memory cell, the data line 510 acting as the bit line bar is continually precharged to the equalization voltage VBL by the control signal PEQ2. As a result, the charge coupling effect occurring between the data lines 500 and 510 is offset.

When the least significant bit of a row address (RAO) in an accessed memory cell is even, the data line 510 acts as the bit line and the data line 500 acts as the bit line bar. As seen from FIG. 11b, the equalization control signal PEQ is output as the control signal PEQ2 for controlling the precharge portion 550. Also, the word line control signal PIX is delayed for a predetermined period of time during charge sharing and inverted and output as the control signal PEQ1 for controlling the precharge portion 540.

The control signal PEQ2 is active only during precharging to enable the precharge portion 550 to precharge the data line 510 to the equalization voltage VBL. The control signal PEQ1 is active during precharging and charge sharing to enable the precharge portion 540 to precharge the data line 500 to the equalization voltage VBL. Therefore, while the data line 510 acting as the bit line shares charge with an accessed memory cell, the data line 500 acting as the bit line bar is continually precharged to the equalization voltage VBL by the control signal PEQ1. As a result, the charge coupling effect occurring between the data lines 500 and 510 is offset.

Figure 1:
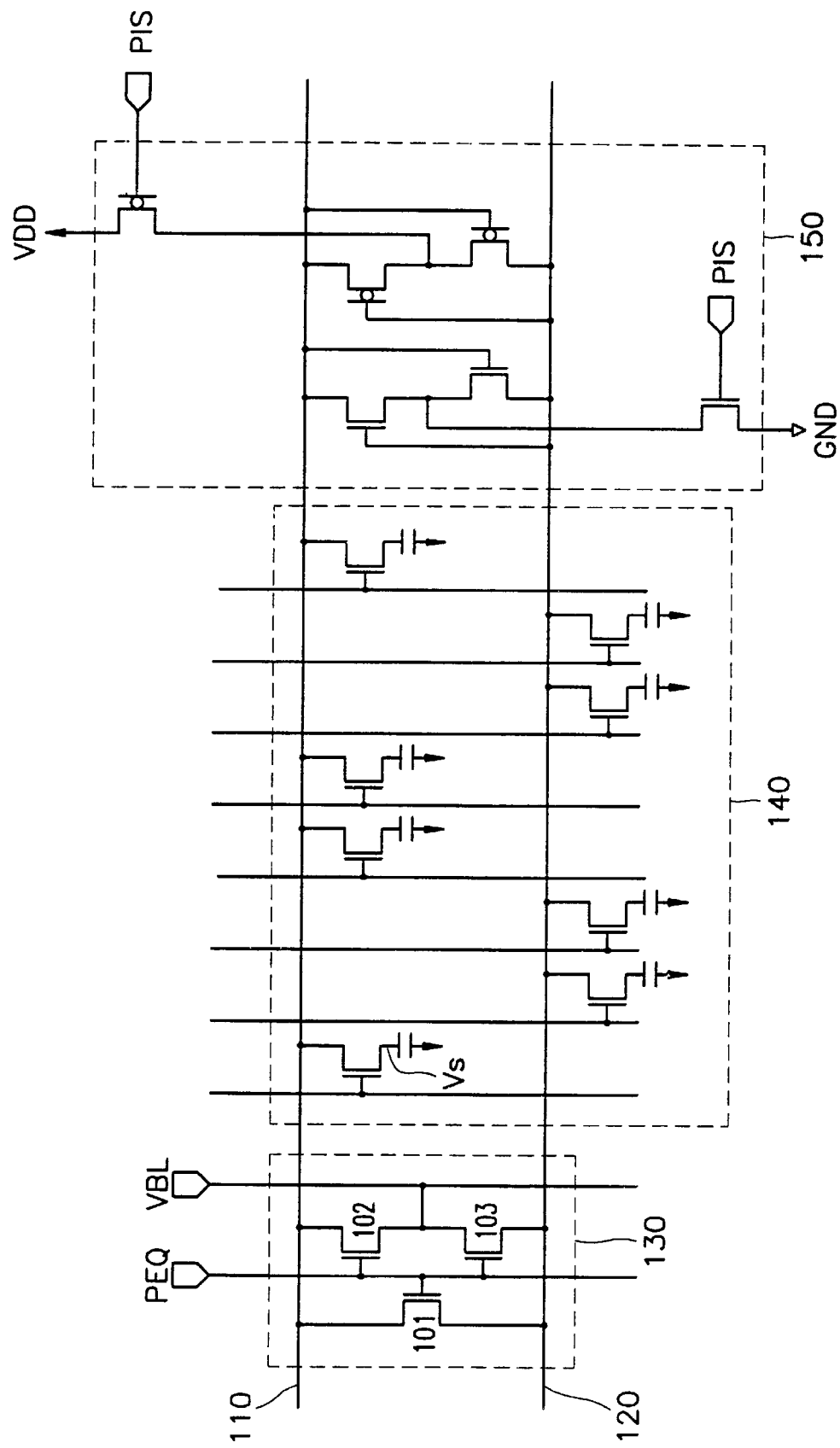
FIG. 1 is a circuit diagram of a conventional bit line control circuit.
Figure 2:
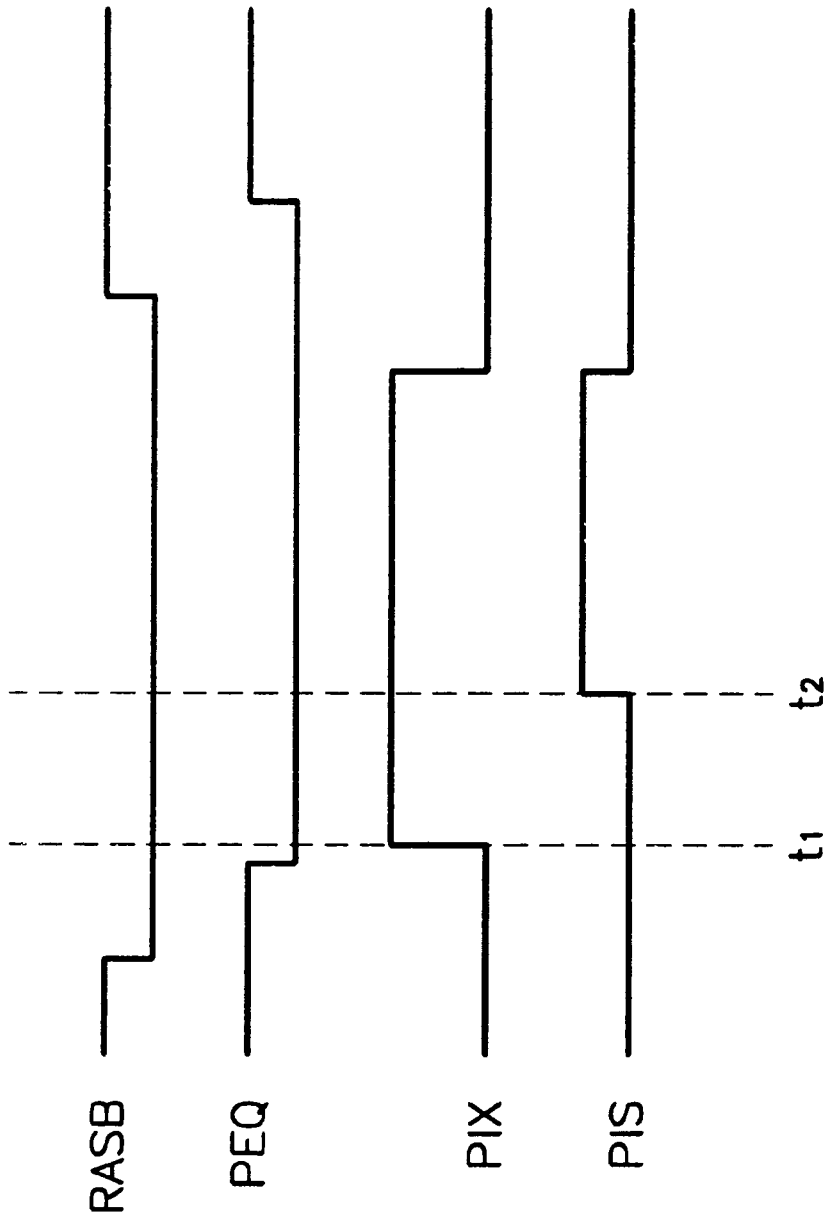
FIG. 2 is a timing chart of each signal on the bit line control circuit shown in FIG. 1.
Figure 3:
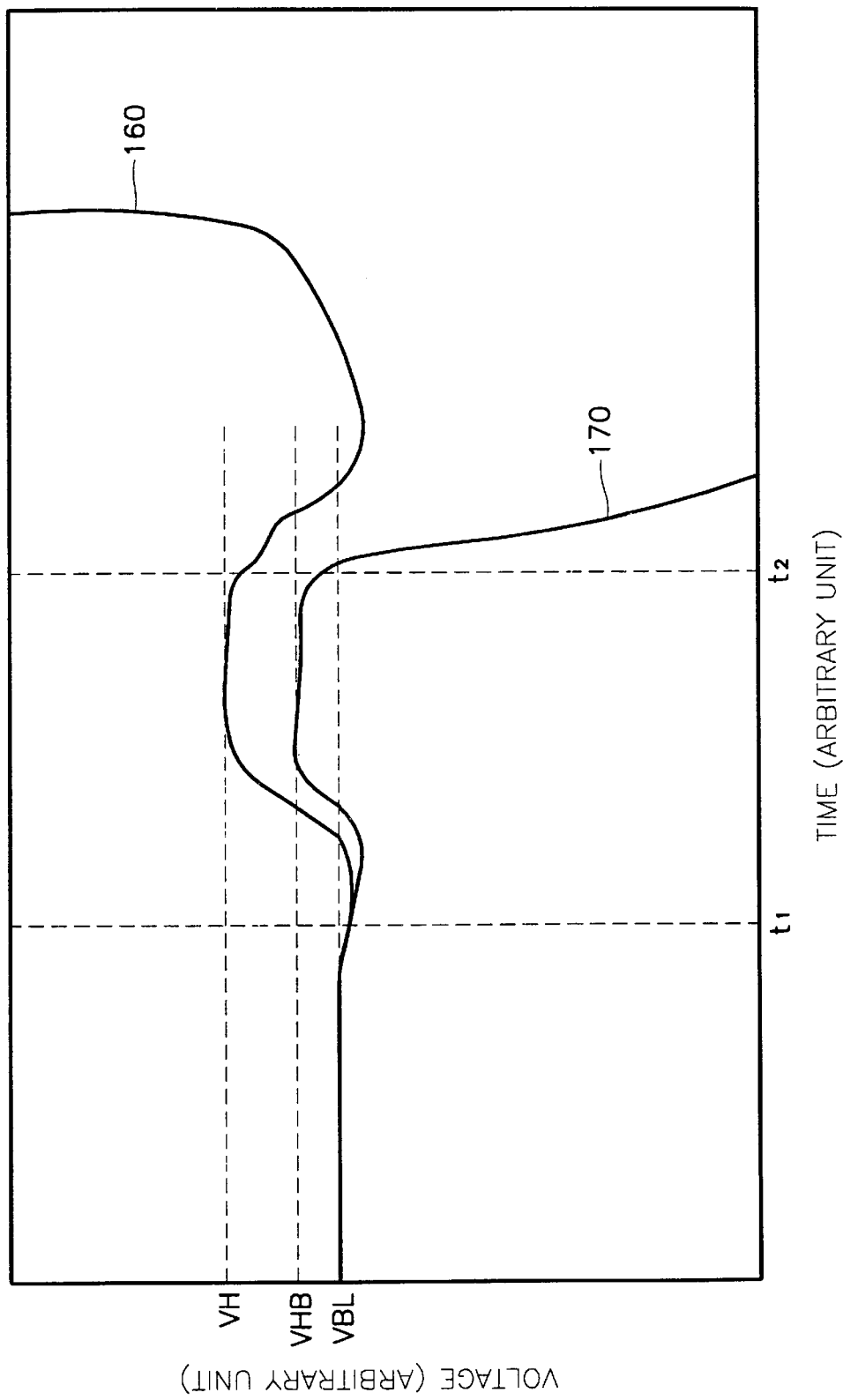
FIG. 3 shows the results of a simulation with respect to the bit line control circuit shown in FIG. 1.
Figure 12:
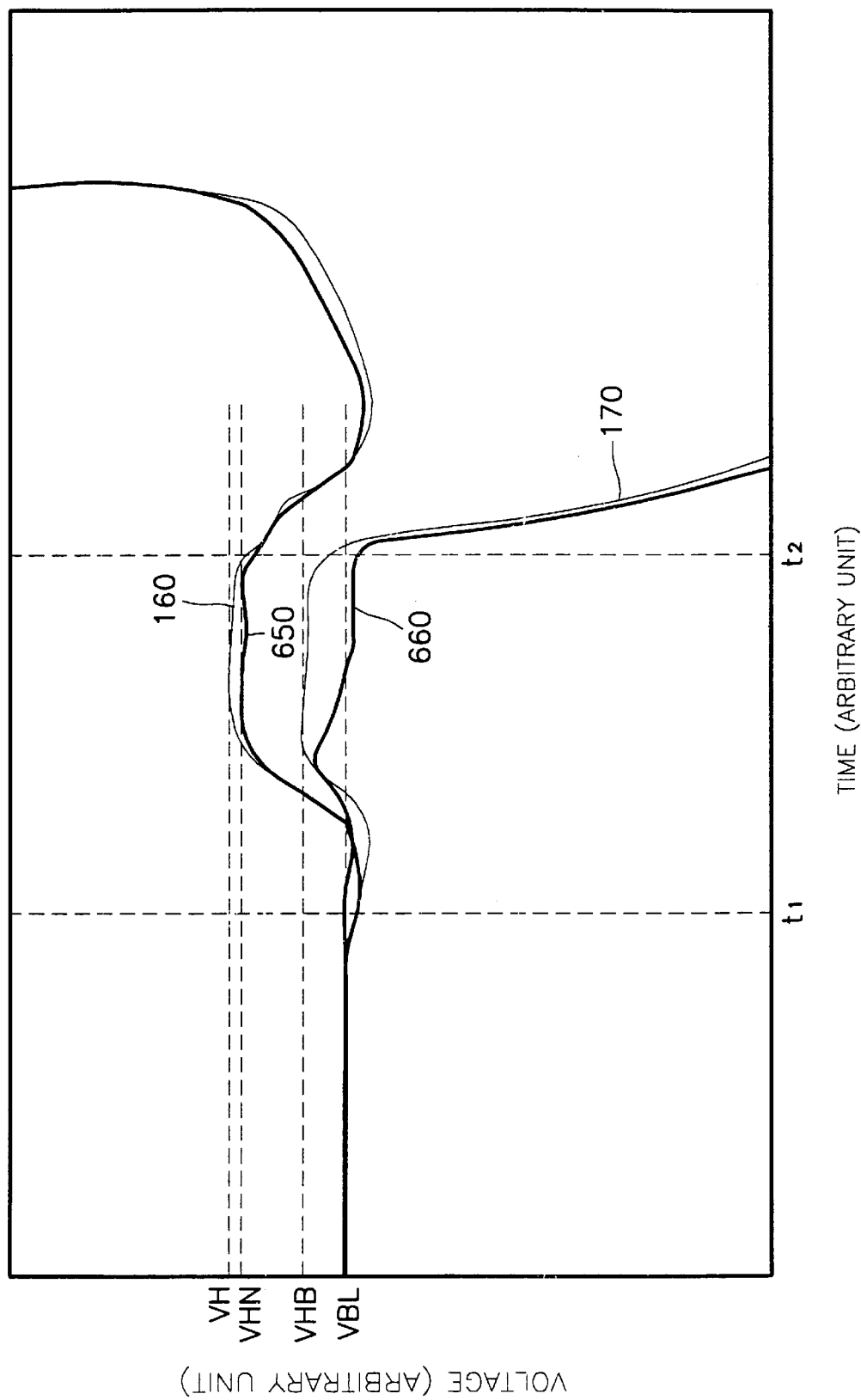
FIG. 12 shows the results of a simulation with respect to a bit line recognizing circuit shown in FIG. 10.

FIG. 12 shows the results of a simulation with respect to the bit line control circuit of FIG. 9 and comparing the results with the conventional circuit of FIG. 3. A vertical axis denotes a voltage level and a horizontal axis denotes the time. Reference numerals 160 and 170 are the voltage potentials of the bit line and the bit line bar for the simulation with respect to a conventional bit line control method, respectively. Reference numerals 650 and 660 are the voltage potentials of the bit line and the bit line bar simulation results according to the present invention, respectively. Reference numeral t1 denotes the time when a charge sharing operation starts, and reference numeral t2 denotes the time when a sensing and amplifying operation starts by the sense and amplification portion 590.

During precharging, the data lines are both precharged to the equalization voltage VBL before the charge sharing. During charge sharing (between t1 and t2), the potential of the data line acting as the bit line rises to VHN due to the charge sharing of the data line with a corresponding memory cell. The data line acting as the bit line bar is continually precharged to the equalization voltage VBL by the corresponding precharge portion. After charge sharing ends, the potential difference (VHN−VBL) between the data lines 500 and 510 maintains a predetermined value which can be sufficiently sensed by the sense and amplification portion 590. Thus, the coupling effect occurring between the data lines 500 and 510 is prevented so that an accurate reading of data is possible.

Figure 13:
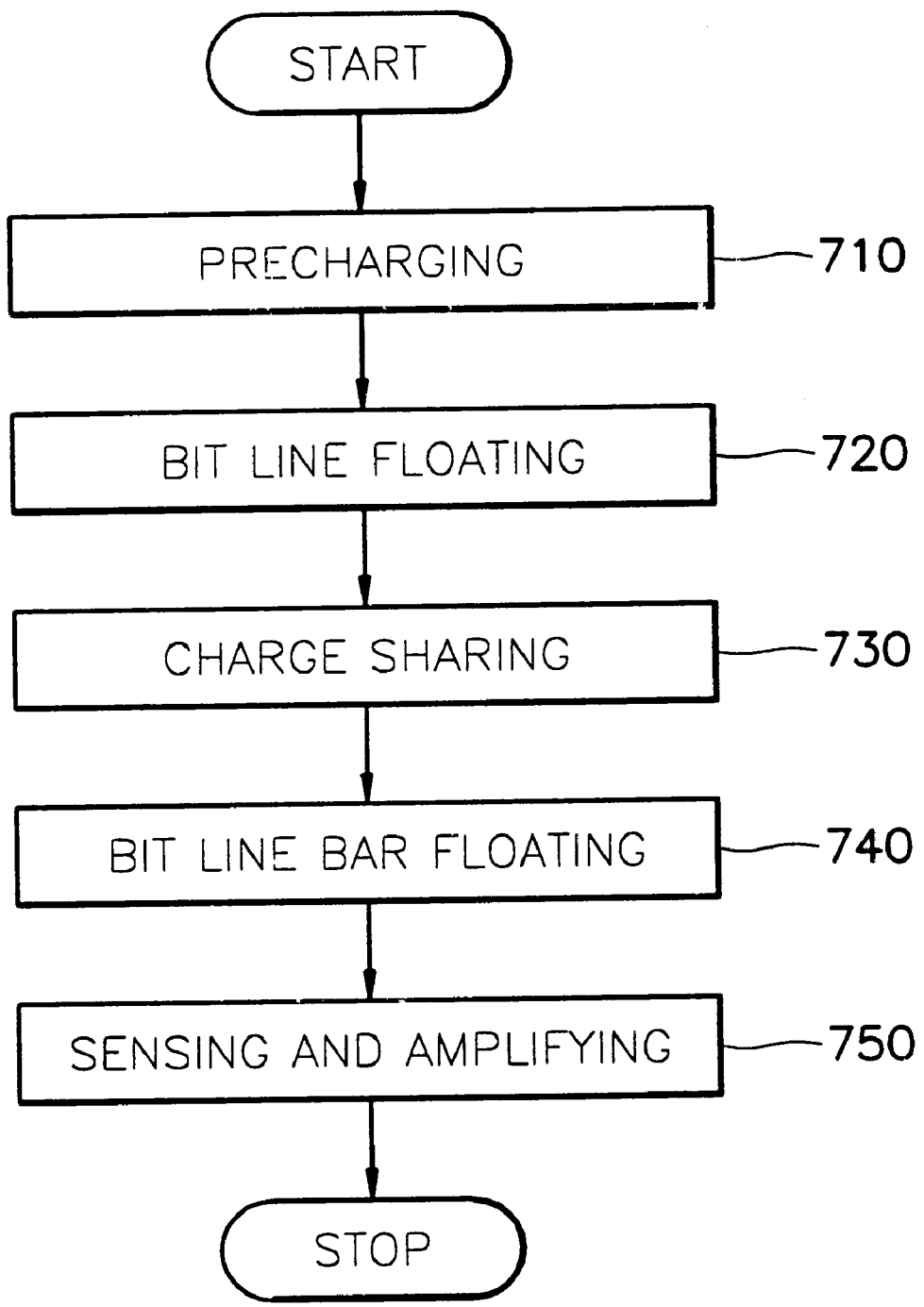
FIG. 13 is a flowchart outlining a bit line controlling method according to a first embodiment of the present invention.

FIG. 13 is a flowchart outlining a bit line control method according to a first embodiment of the present invention. A semiconductor memory device includes a bit line and a bit line bar, the bit line control method of the present invention includes a precharging step 710, a bit line floating step 720, a charge sharing step 730, a bit line bar floating step 740, and a sensing and amplifying step 750.

In the precharging step 710, the bit line and the bit line bar are precharged to a predetermined identical level, i.e., equalization voltage VBL. In the bit line floating step 720, the bit line is floated after the precharging step 710. After the bit line floating step 720, a word line of a corresponding memory cell is enabled, and the floated bit line shares charge with a corresponding memory cell, in the charge sharing step 730.

After the charge sharing step 730, the bit line bar is floated in the bit line bar floating step 740. After the bit line bar floating step 740, the difference in level between the bit line and the bit line bar is sensed and amplified in the sensing and amplifying step 750.

Since the bit line bar floating step 740 floats the precharged bit line bar after the charge sharing step 730, the coupling effect occurring between the bit line and bit line bar in the charge sharing step 730 is offset. That is, the potential levels of the bit line and the bit line bar maintain a predetermined value which can be sufficiently sensed in the sensing and amplifying step 750 after the charge sharing step 730. Thus, data is accurately read.

Figure 14:
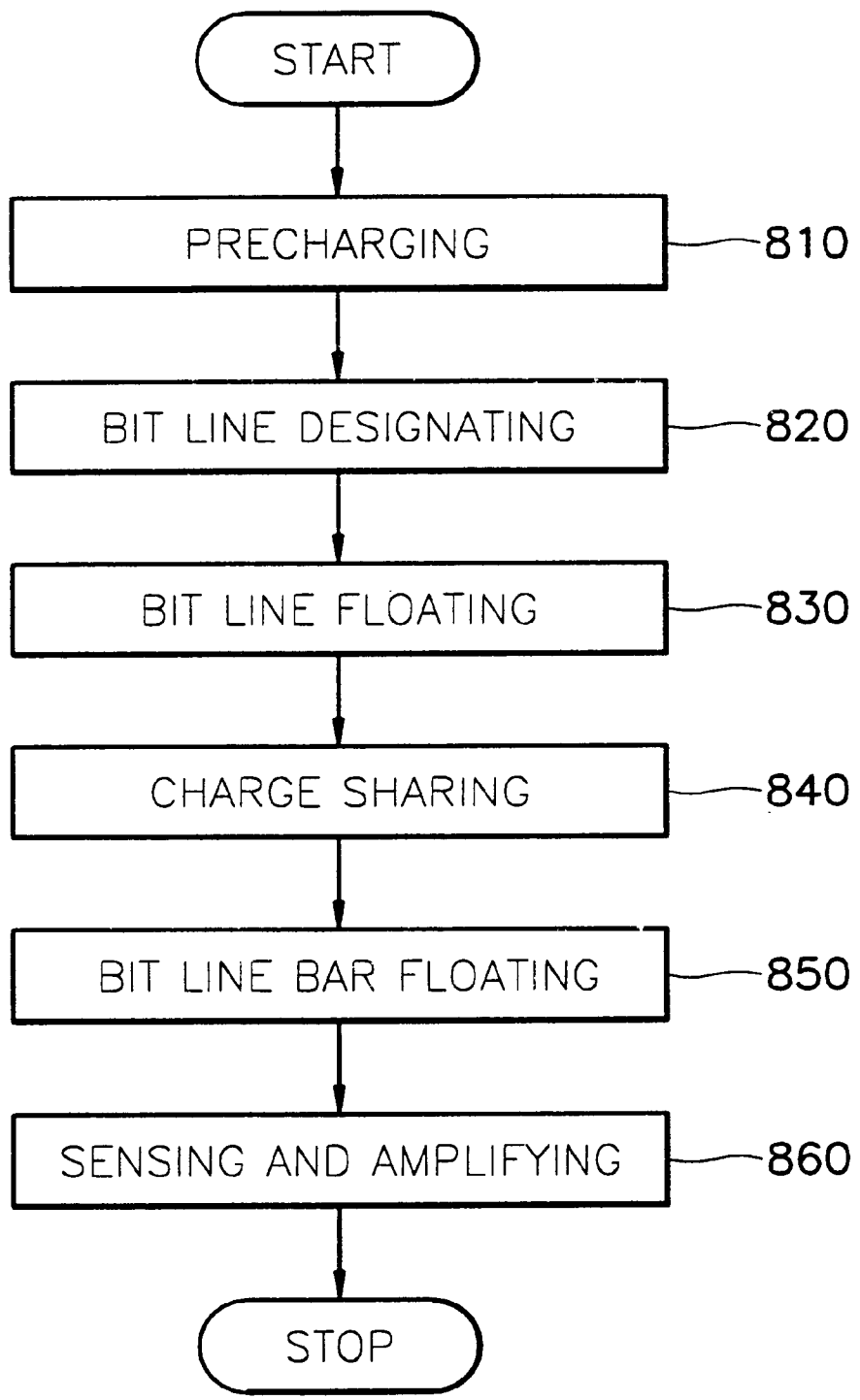
FIG. 14 is a flowchart outlining a bit line controlling method according to a second embodiment of the present invention.

FIG. 14 is a flowchart for outlining a bit line controlling method according to ta second embodiment of the present invention. A semiconductor memory device has first and second data lines, first and second precharge portions and an equalizer. The bit line control method of the present invention includes a precharging step 810, a bit line designating step 820, a bit line floating step 830, a charge sharing step 840, a bit line bar floating step 850 and a sensing and amplifying step 860.

In the precharging step 810, the first and second data lines are precharged to predetermined levels by the first and second precharge portions and equalized by the equalizer. In the bit line designating step 820, one of the first and second data lines is designated as a bit line and the other is designated as a bit line bar according to row address information and the row address strobe signal RASB. For example, in the case of a semiconductor memory device having a folded structure, when the least significant bit of a row address in a memory cell is odd, the first and second data lines are designated as the bit line and the bit line bar, respectively, in the bit line designating step 820. On the other hand, when the least significant bit of a row address in a memory cell is even, the second and first data lines are designated as the bit line and the bit line bar, respectively, in the bit line designating step 820.

In the bit line floating step 830, the data line designated as the bit line is floated. Thereafter, in the charge sharing step 840, a word line of a corresponding memory cell is enabled to allow the floated bit line to share charge with a corresponding memory cell.

The data line designated as the bit line bar is floated in the bit line bar floating step 850. After the bit line bar floating step, the difference in voltage levels between the bit line and the bit line bar is sensed and amplified in the sensing and amplifying step 860.

Since the bit line bar floating step 850 floats the voltage level of the precharged bit line bar after the charge sharing step 840, a coupling effect occurring between the data line acting as the bit line and that acting as the bit line bar in the charge sharing step 840 is offset. That is, the potential levels of the data line acting as the bit line and the data line acting as the bit line bar maintain a predetermined value which is sufficiently sensed in the sensing and amplifying step 860 after the charge sharing step 840. Thus, data is accurately read.

According to the present invention, the bit line continually precharges the voltage level of the bit line bar to a predetermined level while sharing charge with a corresponding memory cell. Thus, a coupling effect occurring between the bit line and the bit line bar during the charge sharing operation is offset. Therefore, after the charge sharing operation, the difference in a potential level between the bit line and the bit line bar maintains a predetermined value which is effectively sensed by a sense and amplification portion.

Having described and illustrated the principles of the invention in a preferred embodiment thereof, it should be apparent that the invention can be modified in arrangement and detail without departing from such principles. I claim all modifications and variation coming within the spirit and scope of the following claims.

What is claimed is:

1. A bit line control circuit for a semiconductor memory device comprising:
    a bit line and a bit line bar;
    an equalization power line for supplying equalization voltage;
    a first precharge circuit connected between the equalization power line and the bit line for precharging the bit line to the equalization voltage during a precharge operation, the first precharge circuit floating the bit line during a charge sharing operation; and
    a second precharge circuit connected between the equalization power line and the bit line bar and separately enabled from the first precharge circuit for precharging the bit line bar to the equalization voltage during the precharging operation and during the charge sharing operation at a same time the first precharge circuit is floating the bit line.

2. The bit line control circuit of claim 1 further including an equalizer connected between the bit line and the bit line bar, the equalizer controlled by an equalizing signal and activated during the precharging operation to equalize voltage levels for the bit line and the bit line bar.

3. The bit line control circuit of claim 2 wherein the equalizer is comprised of an NMOS transistor.

4. The bit line control circuit of claim 1 including a sense and amplification circuit for sensing and amplifying a difference in voltage levels between the bit line and the bit line bar after the charge sharing operation.

5. The bit line control circuit of claim 1 wherein the first precharge circuit comprises an NMOS transistor.

6. The bit line control circuit of claim 1 wherein the second precharge circuit is comprised of an NMOS transistor.

7. The bit line control circuit of claim 1 including a precharge control circuit for generating a first precharge control signal for controlling the first precharge circuit and a second precharge control signal for controlling the second precharge circuit.

8. The bit line control circuit of claim 7 wherein the precharge control circuit comprises:
    a first precharging control signal generator for receiving an equalizing control signal which is active during the precharging operation and outputting the equalizing control signal as the first precharging control signal; and a second precharging control signal generator for outputting the second precharging control signal by delaying the equalizing control signal for a predetermined period of time synchronizing the delayed signal with the equalizing control signal.

9. The bit line control circuit of claim 7 wherein the precharging control device comprises:

a first precharging control signal generator for receiving an equalizing control signal which is active during the precharging operation and outputting the equalizing control signal as the first precharging control signal; and a second precharging control signal generator for receiving an address signal for driving a corresponding word line of a row address strobe signal, delaying the address signal for a predetermined period of time to generate a delay signal, and outputting an inversion signal of the delay signal as the second precharging control signal.

10. A bit line control circuit in a semiconductor memory device comprising:

a first data line;

a second data line;

an equalization power line through which equalization voltage is supplied;

a first precharge circuit connected between the equalization power line and the first data line and controlled by a first precharging control signal for precharging the first data line during a precharging operation;

a second precharge circuit connected between the equalization power line and the second data line and controlled by a second precharging control signal for precharging the second data line during the precharging operation; and wherein when the first data line is a bit line and the second data line is a bit line bar, the first precharge circuit is disabled and the second precharge circuit is enabled during a charge sharing operation, and when the second data line is a bit line and the first data line is a bit line bar, the second precharge circuit is disabled and the first precharge circuit is enabled during charge sharing.

11. The bit line control circuit of claim 10 further including an equalizer connected between the first and second data lines, controlled by an equalizing signal, and activated during the precharging operation to equalize voltage levels on the first and second data lines.

12. The bit line control circuit of claim 11 wherein the equalizer comprises an NMOS transistor.

13. The bit line control circuit of claim 10 further including a sensing and amplifying circuit for sensing and amplifying a difference in voltage levels between the first and second data lines after the first and second data lines perform the charge sharing operation.

14. The bit line control circuit of claim 10 wherein the first precharge circuit comprises an NMOS transistor.

15. The bit line control circuit of claim 10 wherein the second precharge circuit comprises an NMOS transistor.

16. The bit line control circuit of claim 10 further including a bit line recognizing circuit for outputting the first and second precharging control signals by recognizing and selecting one of the first and second data lines as a bit line and the other as a bit line bar.

17. The bit line control circuit of claim 16 wherein the bit line recognizing circuit comprises:

a precharging control signal generator for generating a bit line precharging signal for precharging the bit line during the precharging operation and floating the bit line during the charge sharing operation and a bit line bar precharging signal for precharging the bit line bar during the precharging operation and charge sharing operation;

a first precharging control circuit for outputting the bit line precharging signal as the first precharging control signal when a memory cell selected according to a row address is connected to the first data line, and outputting the bit line bar precharging signal as the first precharging control signal when the memory cell is not connected to the first data line; and a second precharging control circuit for outputting the bit line precharging signal as the second precharging control signal when a memory cell selected according to the row address is connected to the first data line, and outputting the bit line bar precharging signal as the second precharging control signal when the memory cell is not connected to the first data line.

18. The bit line control circuit of claim 17 wherein the first precharging control circuit outputs the bit line precharging signal as the first precharging control signal when the least significant bit of the row address is odd, and outputs the bit line bar precharging signal as the first precharging control signal when the least significant bit of the row address is even.

19. The bit line control circuit of claim 17 wherein the second precharging control circuit outputs the bit line precharging signal as the first precharging control signal when the least significant bit of the row address is odd, and outputs the bit line bar precharging signal as the second precharging control signal when the least significant bit of the row address is even.

20. The bit line control circuit of claim 17 wherein the precharging control signal generator comprises:

a bit line precharging control signal generator for receiving an equalizing control signal which is active during the precharging operation and outputs the equalization control signal as the bit line precharging signal; and a bit line bar precharging control signal for generating a delay signal by delaying the equalizing control signal for a predetermined period of time, synchronizing the delay with the equalizing control signal, and outputting the result as the bit line bar precharging signal.

21. The bit line control circuit of claim 17 wherein the precharging control signal generator comprises:

a bit line precharging control signal generator for receiving an equalizing control signal which is activated during the precharging operation and outputting the equalization control signal as the bit line precharging signal; and a bit line bar precharging control signal generator for receiving a signal generated to drive a corresponding word line according to a row address strobe signal, generating a delay signal by delaying the signal for a predetermined period of time, and outputting an inversion signal of the delay signal as the bit line bar precharging signal.

22. A method for controlling a bit line and a bit line bar in a semiconductor memory device comprising:

independently controlling precharging of the bit line and the bit line bar;

precharging the bit line and the bit line bar to substantially equal predetermined levels;

floating the bit line while at the same time maintaining precharging of the bit line bar;

enabling a word line of a corresponding memory cell to allow the floated bit line to share charge with the corresponding memory cell line while at the same time maintaining precharging of the bit line bar; and floating the bit line bar after sharing the charge.

23. The method of claim 22 including sensing and amplifying the difference in a level between the bit line and the bit line bar after floating the bit line bar.

24. A method for controlling a semiconductor memory device having first and second data lines, first and second precharge means, and an equalizer comprising:

precharging the first and second data lines to a predetermined level by the first and second precharge means;

equalizing the first and second data lines to substantially equal voltage levels;

designating one of the first and second data lines as a bit line and the other data line as a bit line bar using received row address information according to a row address strobe signal;

floating the data line designated as the bit line;

enabling a word line of a corresponding memory cell to allow the floated bit line to share charge with the corresponding memory cell; and floating the data line designated as the bit line bar.

25. The method of claim 24 including sensing and amplifying the difference in a voltage level between the bit line and the bit line bar after floating the bit line bar.

26. The method of claim 24 wherein the bit line and the bit line bar are designated using a row address in the memory cell.

27. The method of claim 26 wherein the first data line is designated as a bit line and the second data line is designated as a bit line bar when the least significant bit of a row address in a memory cell is odd.

28. The method of claim 26 wherein the second data line is designated as a bit line and the first data line is designated as a bit line bar when the least significant bit of a row address in a memory cell is even.

* * * * *